(12) United States Patent
Hattori et al.

(10) Patent No.: US 8,717,765 B2
(45) Date of Patent: May 6, 2014

(54) INTEGRATED-INVERTER ELECTRIC COMPRESSOR AND INVERTER UNIT THEREOF

(75) Inventors: Makoto Hattori, Aichi (JP); Kazuki Niwa, Aichi (JP); Takashi Nakagami, Aichi (JP); Koji Nakano, Aichi (JP); Shunsuke Yakushiji, Aichi (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 642 days.

(21) Appl. No.: 13/000,775

(22) PCT Filed: Nov. 26, 2009

(86) PCT No.: PCT/JP2009/069918
§ 371 (c)(1),
(2), (4) Date: Dec. 22, 2010

(87) PCT Pub. No.: WO2010/064565
PCT Pub. Date: Jun. 10, 2010

(65) Prior Publication Data
US 2011/0095659 A1 Apr. 28, 2011

(30) Foreign Application Priority Data
Dec. 5, 2008 (JP) ................................ 2008-311305

(51) Int. Cl.
*H05K 7/20* (2006.01)
*H05K 1/02* (2006.01)
*H05K 5/02* (2006.01)
*H01L 25/00* (2006.01)

(52) U.S. Cl.
CPC .............. *H01L 25/00* (2013.01); *H05K 1/0201* (2013.01); *H05K 5/0247* (2013.01)
USPC .......................... 361/705; 307/151; 310/68 D (58) Field of Classification Search
CPC ...... H05K 1/0201; H05K 5/0247; H01L 25/00
USPC ............................ 307/151; 310/684; 361/705
See application file for complete search history.

(56) References Cited

U.S. PATENT DOCUMENTS 5,559,374 A 9/1996 Ohta et al.
7,898,116 B2 * 3/2011 Hattori et al. ................. 307/151

FOREIGN PATENT DOCUMENTS

JP 6-291235 A 10/1994
JP 10-270609 A 10/1998

(Continued)

OTHER PUBLICATIONS

International Search Report of PCT/JP2009/069918, mailing date Dec. 22, 2009.

(Continued)

*Primary Examiner* — Hal Kaplan
(74) *Attorney, Agent, or Firm* — Westerman, Hattori, Daniels & Adrian, LLP (57) ABSTRACT

An integrated-inverter electric compressor and an inverter unit thereof are provided, with which sufficient anti-vibration properties can be ensured and weight reduction can be achieved. In an integrated-inverter electric compressor, an inverter unit includes an inverter module in which a power-system metallic board having mounted thereon semiconductor switching elements and so forth is integrated with a plastic case, and a CPU board having mounted thereon a control and communication circuit that operates at a low voltage, such as a CPU, is provided on a top face of the inverter module, and inside the plastic case, a thermosetting resin layer for insulation and anti-humidity purposes is provided so as to cover a top face of the power-system metallic board, and a vibration-absorbing elastomeric adhesive layer that maintains a rubber state in an operating temperature range of the integrated-inverter electric compressor is provided between a bottom face of the CPU board and the thermosetting resin layer.

7 Claims, 5 Drawing Sheets

(56) References Cited

FOREIGN PATENT DOCUMENTS

| JP | 10270609 | * 10/1998 |
| JP | 2000-150724 A | 5/2000 |
| JP | 2002-325467 A | 11/2002 |
| JP | 2003-153552 A | 5/2003 |
| JP | 2004-053050 A | 2/2004 |
| JP | 2006-316754 A | 11/2006 |
| JP | 2007-315269 A | 12/2007 |

OTHER PUBLICATIONS

Decision of Patent Grant dated Oct. 15, 2013, issued in Japanese Application No. 2008-311305, w/English translation.

* cited by examiner

INTEGRATED-INVERTER ELECTRIC COMPRESSOR AND INVERTER UNIT THEREOF

TECHNICAL FIELD

The present invention relates to an integrated-inverter electric compressor and an inverter unit thereof that are suitable for use in an automobile air conditioner configured by integrating an inverter unit with the periphery of a housing accommodating an electric motor and a compressor.

BACKGROUND ART

As compressors for air conditioners installed in vehicles, hybrid vehicles, or the like, various types of integrated-inverter electric compressor configured by integrating an inverter unit have been proposed. In the integrated-inverter electric compressor, generally, an inverter accommodating unit (inverter box) is provided at the periphery of a housing accommodating an electric motor and a compressor, and an inverter unit that converts DC power supplied from a high-voltage power supply into three-phase AC power and supplies the three-phase AC power to the electric motor via glass-sealed terminals is integrated inside the inverter accommodating unit.

As described in Patent Documents 1 and 2, in the inverter unit, a power-system board (including a pedestal or unit base) having mounted thereon a plurality of power semiconductor switching elements (IGBTs or the like) that convert DC power into three-phase AC power and a CPU board (printed board) having mounted thereon a control and communication circuit including components that operate at a low voltage, such as a CPU, are provided in two upper and lower layers, and these boards are accommodated inside an inverter case or an external case so that the inverter unit is integrated with the periphery of a compressor housing.

An integrated-inverter electric compressor used in an automobile air conditioner is used under severe temperature and vibration conditions, so that its inverter unit is required to have high anti-vibration properties, anti-humidity properties, and insulation properties. Therefore, Patent Documents 1 and 2 propose an arrangement in which a gel-like resin, such as a silicone gel, is filled inside an inverter accommodating unit in which an inverter unit is integrated, an arrangement in which a CPU board is disposed suspended in a gel-like resin, and so forth. Furthermore, Patent Document 3 proposes an arrangement in which a metallic board, a control board, and an interface board are provided in three layers inside a plastic case, the power-semiconductor surface of the metallic board is filled with a gel material, and the region from the surface to the top face of the control board is encapsulated in resin.

CITATION LIST

Patent Literature

{PTL 1}
Japanese Unexamined Patent Application, Publication No. 2006-316754
{PTL 2}
Japanese Unexamined Patent Application, Publication No. 2007-315269
{PTL 3}
Japanese Unexamined Patent Application, Publication No. 2004-53050

SUMMARY OF INVENTION

Technical Problem

However, in the case where a gel-like resin is filled up to a position covering the top face of the CPU board inside the inverter accommodating unit as described in Patent Documents 1 and 2, although it is possible to ensure insulation properties and anti-humidity properties and to improve anti-vibration properties, the gel-like resin filling the entire inverter accommodating unit is heavy and expensive, leading to problems of increased weight and cost of the integrated-inverter electric compressor. In particular, a compressor of an automobile air conditioner is an item in which reduction in size and weight is important. Therefore, how to ensure anti-vibration properties while avoiding an increase in weight is an important issue.

On the other hand, in the case described in Patent Document 3, although insulation properties, anti-humidity properties, and anti-vibration properties can be expected with boards disposed in layers up to the second layer, which are encapsulated in resin, it is difficult to ensure anti-vibration properties for the board in the third layer. Furthermore, since the configuration is such that the control board in the second layer is also encapsulated with the resin, there exists a problem that maintenance is considerably difficult for the control board as well as the metallic board on which the power semiconductor elements are provided.

The present invention has been made in view of the situation described above, and it is an object thereof to provide an integrated-inverter electric compressor and an inverter unit thereof with which it is possible to ensure sufficient anti-vibration properties for a CPU board provided on the top face of an inverter module and to reduce the weight of the inverter unit.

Solution to Problem

In order to solve the problems described above, an integrated-inverter electric compressor and an inverter unit thereof according to the present invention employ the following solutions.

That is, an integrated-inverter electric compressor according to an aspect of the present invention is an integrated-inverter electric compressor in which an inverter accommodating unit is provided at the periphery of a housing accommodating an electric motor and a compressor, and an inverter unit that converts DC power from a high-voltage power supply into three-phase AC power and supplies the three-phase AC power to the electric motor is provided in the inverter accommodating unit, wherein the inverter unit includes an inverter module in which a power-system metallic board having mounted thereon semiconductor switching elements and so forth is integrated with a plastic case having a plurality of terminals and so forth integrally formed therewith by insert molding, and a CPU board having mounted thereon a control and communication circuit that operates at a low voltage, such as a CPU, is provided on a top face of the inverter module, and wherein, inside the plastic case, a thermosetting resin layer for insulation and anti-humidity purposes is provided so as to cover a top face of the power-system metallic board, and a vibration-absorbing elastomeric adhesive layer that maintains a rubber state in an operating temperature range of the electric compressor is provided between a bottom face of the CPU board and the thermosetting resin layer.

According to the above aspect, inside the plastic case of the inverter module, the thermosetting resin layer for insulation and anti-humidity purposes is provided so as to cover the top face of the power-system metallic board, and the vibration-absorbing elastomeric adhesive layer that maintains a rubber state in the operating temperature range of the electric compressor is provided between the bottom face of the CPU board provided on the top face of the inverter module and the thermosetting resin layer. Thus, it is possible to firmly secure and protect the semiconductor switching elements and so forth mounted on the power-system metallic board with the thermosetting resin layer covering the top face of the power-system metallic board, ensuring insulation properties and anti-humidity properties of the power-system metallic board, to which a high voltage is applied. Furthermore, vibration generating forces applied to the CPU board can be absorbed by the elastomeric adhesive layer provided on the bottom face thereof, so that damage to and detachment of the components on the CPU board caused by vibration of the board can be prevented. Accordingly, by providing the two resin layers individually suitable for protecting the power-system metallic board and the CPU board inside the plastic case of the inverter module, it is possible to suitably protect the two boards individually with a small amount of resin, which serves to improve the reliability of the inverter unit regarding anti-vibration properties and to reduce the weight of the integrated-inverter electric compressor.

Furthermore, with an integrated-inverter electric compressor according to an aspect of the present invention, in the integrated-inverter electric compressor described above, the elastomeric adhesive layer may be provided in association with only a specific area, such as a central area of the CPU board or an area under heavy components provided on the CPU board, such as a transformer and an electrolytic capacitor.

According to the above aspect, since the elastomeric adhesive layer is provided in association with only a specific area, such as a central area of the CPU board or an area under heavy components provided on the CPU board, such as a transformer and an electrolytic capacitor, vibrations of the CPU board can be absorbed via the elastomeric adhesive layer in the central area of the CPU board, the area under heavy components provided on the CPU board, such as a transformer and an electrolytic capacitor, or the like, where vibrations particularly tend to occur. Therefore, it is possible to restrain vibrations of the CPU board effectively while restricting the amount of elastomeric adhesive used. Accordingly, it is possible to reduce the weight and cost of the inverter unit.

Furthermore, with an integrated-inverter electric compressor according to an aspect of the present invention, in the integrated-inverter electric compressor described above, the elastomeric adhesive layer may be provided over the substantially entire region between the bottom face of the CPU board and the thermosetting resin layer.

According to the above aspect, since the elastomeric adhesive layer is provided over the substantially entire region between the bottom face of the CPU board and the thermosetting resin layer, the entire bottom face of the CPU board is supported by the elastomeric adhesive layer, so that vibrations of the CPU board can be absorbed. In this case, although the amount of elastomeric adhesive used becomes somewhat larger, it is possible to give priority to reducing vibrations of the CPU board, so that anti-vibration properties of the inverter unit can be further improved.

Furthermore, with an integrated-inverter electric compressor according to an aspect of the present invention, in any one of the integrated-inverter electric compressors described above, the thermosetting resin layer may be formed of an epoxy resin.

According to the above aspect, since the thermosetting resin layer is formed of an epoxy resin, it is possible to cover (encapsulate) the components mounted on the power-system metallic board with the thermosetting epoxy resin layer having superior insulation and anti-humidity properties, thereby firmly securing and protecting the components. Accordingly, it is possible to ensure sufficient insulation properties, anti-humidity properties, and anti-vibration properties of the power-system metallic board.

Furthermore, with an integrated-inverter electric compressor according to an aspect of the present invention, in any one of the integrated-inverter electric compressors described above, the elastomeric adhesive layer may be formed of a silicone-resin adhesive.

According to the above aspect, since the elastomeric adhesive layer is formed of a silicone-resin adhesive, it is possible to elastically support the bottom face of the CPU board with the silicone-resin adhesive layer having superior heat resistance and elasticity in a wide temperature range from a low-temperature range to a high-temperature range, so that vibration generating forces applied to the CPU board can be absorbed. Accordingly, it is possible to reliably prevent damage to and detachment of the components on the CPU board caused by vibration of the board, considerably improving the anti-vibration properties of the inverter unit.

Furthermore, with an integrated-inverter electric compressor according to an aspect of the present invention, in the integrated-inverter electric compressor described above, the silicone-resin adhesive may have a glass transition temperature set at or below $-40°$ C.

According to the above aspect, since the silicone-resin adhesive has a glass transition temperature set at or below $-40°$ C., when applied to the integrated-inverter electric compressor 1 for automobile use, which must be operable even in a low-temperature environment at about $-40°$ C., the elastomeric adhesive layer can maintain a rubber state and elastically support the CPU board. Accordingly, it is possible to attain a sufficient vibration absorbing effect even in an extremely-low-temperature environment.

Furthermore, an inverter unit according to an aspect of the present invention may be a modularized inverter unit that is integrated in an integrated-inverter electric compressor, wherein the inverter unit includes an inverter module in which a power-system metallic board having mounted thereon semiconductor switching elements and so forth is integrated with a plastic case having a plurality of terminals and so forth integrally formed therewith by insert molding, and a CPU board having mounted thereon a control and communication circuit that operates at a low voltage, such as a CPU, is provided on a top face of the inverter module, and wherein, inside the plastic case, a thermosetting resin layer for insulation and anti-humidity purposes is provided so as to cover a top face of the power-system metallic board, and a vibration-absorbing elastomeric adhesive layer that maintains a rubber state in an operating temperature range of the electric compressor is provided between a bottom face of the CPU board and the thermosetting resin layer.

According to the above aspect, inside the plastic case of the inverter module, the thermosetting resin layer for insulation and anti-humidity purposes is provided so as to cover the top face of the power-system metallic board, and the vibration-absorbing elastomeric adhesive layer that maintains a rubber state in the operating temperature range of the electric compressor is provided between the bottom face of the CPU board provided on the top face of the inverter module and the thermosetting resin layer. Thus, it is possible to firmly secure and protect the semiconductor switching elements and so forth mounted on the power-system metallic board with the thermosetting resin layer covering the top face of the power-system metallic board, ensuring insulation properties and anti-humidity properties of the power-system metallic board, to which a high voltage is applied. Furthermore, vibration generating forces applied to the CPU board can be absorbed by the elastomeric adhesive layer provided on the bottom face thereof, so that damage to and detachment of the components on the CPU board caused by vibration of the board can be prevented. Accordingly, by providing the two resin layers individually suitable for protecting the power-system metallic board and the CPU board inside the plastic case of the inverter module, it is possible to suitably protect the two boards individually with a small amount of resin, which serves to improve the reliability of the inverter unit regarding anti-vibration properties and to reduce the weight of the inverter unit.

Advantageous Effects of Invention

With the integrated-inverter electric compressor and the inverter unit thereof according to the present invention, it is possible to firmly secure and protect the semiconductor switching elements and so forth mounted on the power-system metallic board with the thermosetting resin layer covering the top face of the power-system metallic board, ensuring insulation properties and anti-humidity properties of the power-system metallic board, to which a high voltage is applied. Furthermore, vibration generating forces applied to the CPU board can be absorbed by the elastomeric adhesive layer provided on the bottom face thereof, so that damage to and detachment of the components on the CPU board caused by vibration of the board can be prevented. Accordingly, by providing the two resin layers individually suitable for protecting the power-system metallic board and the CPU board inside the plastic case of the inverter module, it is possible to suitably protect the two boards individually with a small amount of resin, which serves to improve the reliability of the inverter unit regarding anti-vibration properties and to reduce the weight of the inverter unit and the integrated-inverter electric compressor.

DESCRIPTION OF EMBODIMENTS

Embodiments of the present invention will be described below with reference to the drawings.

First Embodiment

A first embodiment of the present invention will be described with reference to FIGS. 1 to 3 and FIG. 5.

Figure 1:
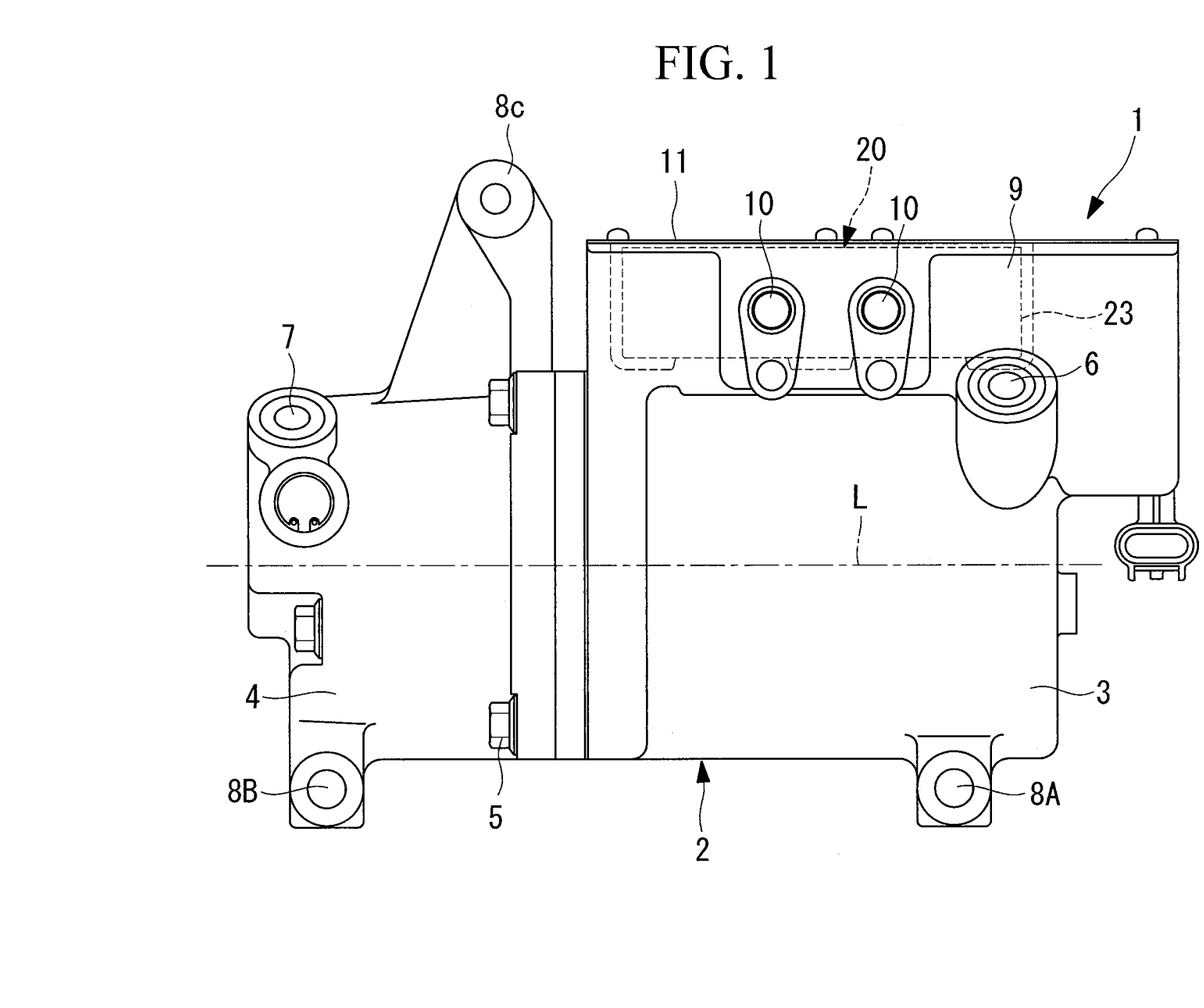
FIG. 1 is an external side view of an integrated-inverter electric compressor according to a first embodiment of the present invention.

FIG. 1 shows an external side view of an integrated-inverter electric compressor 1 according to the first embodiment of the present invention.

The integrated-inverter electric compressor 1 includes a housing 2 constituting an external case. The housing 2 is constructed by fastening together a motor housing 3 accommodating an electric motor (not shown) and a compressor housing 4 accommodating a compressor (not shown) via bolts 5. The motor housing 3 and the compressor housing 4 are pressure-resistant cases and are formed by aluminum die casting.

The electric motor and the compressor accommodated inside the housing 2, which are not shown, are linked together via a motor shaft and are thus configured so that the compressor is driven by rotation of the electric motor. At one end of the motor housing 3 (right side in FIG. 1), a refrigerant intake port 6 is provided. Low-temperature, low-pressure refrigerant gas taken into the motor housing 3 from the refrigerant intake port 6 flows around the electric motor in the direction of a motor axis L and is then taken into and compressed by the compressor. The arrangement is such that the high-temperature, high-pressure refrigerant gas compressed by the compressor is discharged into the compressor housing 4 and is then discharged to the outside from a discharge port 7 provided at one end of the compressor housing 4 (left side in FIG. 1).

For example, the housing 2 is provided with attachment legs 8A, 8B, and 8C at three points in total, specifically, two points at the bottom on one end of the motor housing 3 (right side in FIG. 1) and at the bottom on one end of the compressor housing 4 (left side in FIG. 1), and one point at the top of the compressor housing 4. The integrated-inverter electric compressor 1 is installed on a vehicle by fastening the attachment legs 8A, 8B, and 8C via brackets and bolts with a side wall or the like of a vehicle-running prime mover installed in an engine compartment of the vehicle.

At the periphery of the motor housing 3, a box-shaped inverter accommodating unit 9 is formed integrally at the top thereof. The inverter accommodating unit 9 has a box shape having an open top and surrounded by a wall having a certain height, and two cable lead-out ports 10 are provided on a side face thereof. Furthermore, the top face of the inverter accommodating unit 9 is closed by fastening a lid 11 thereto via screws.

Figure 2:
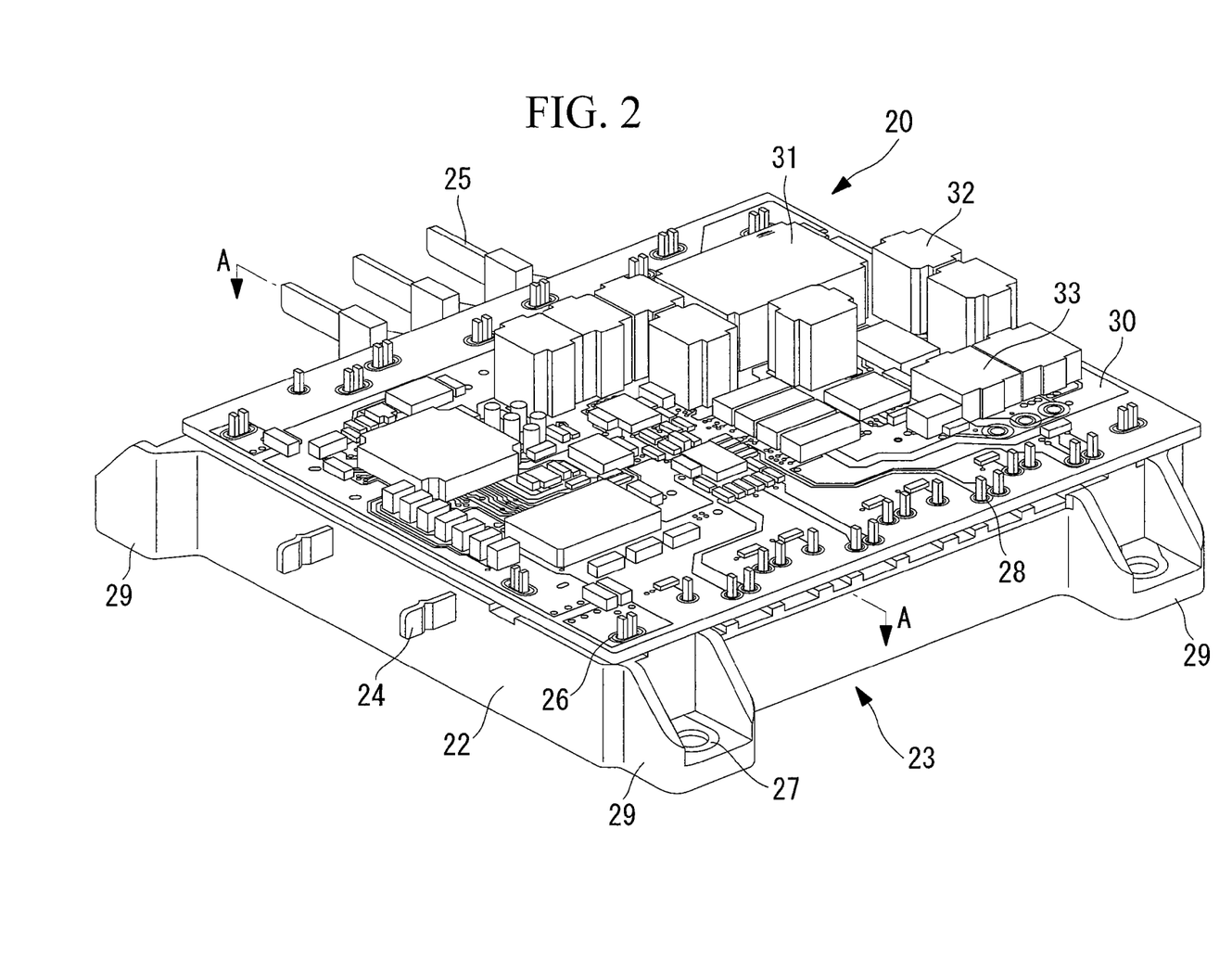
FIG. 2 is a perspective view of an inverter unit integrated in the integrated-inverter electric compressor shown in FIG. 1.
Figure 3:
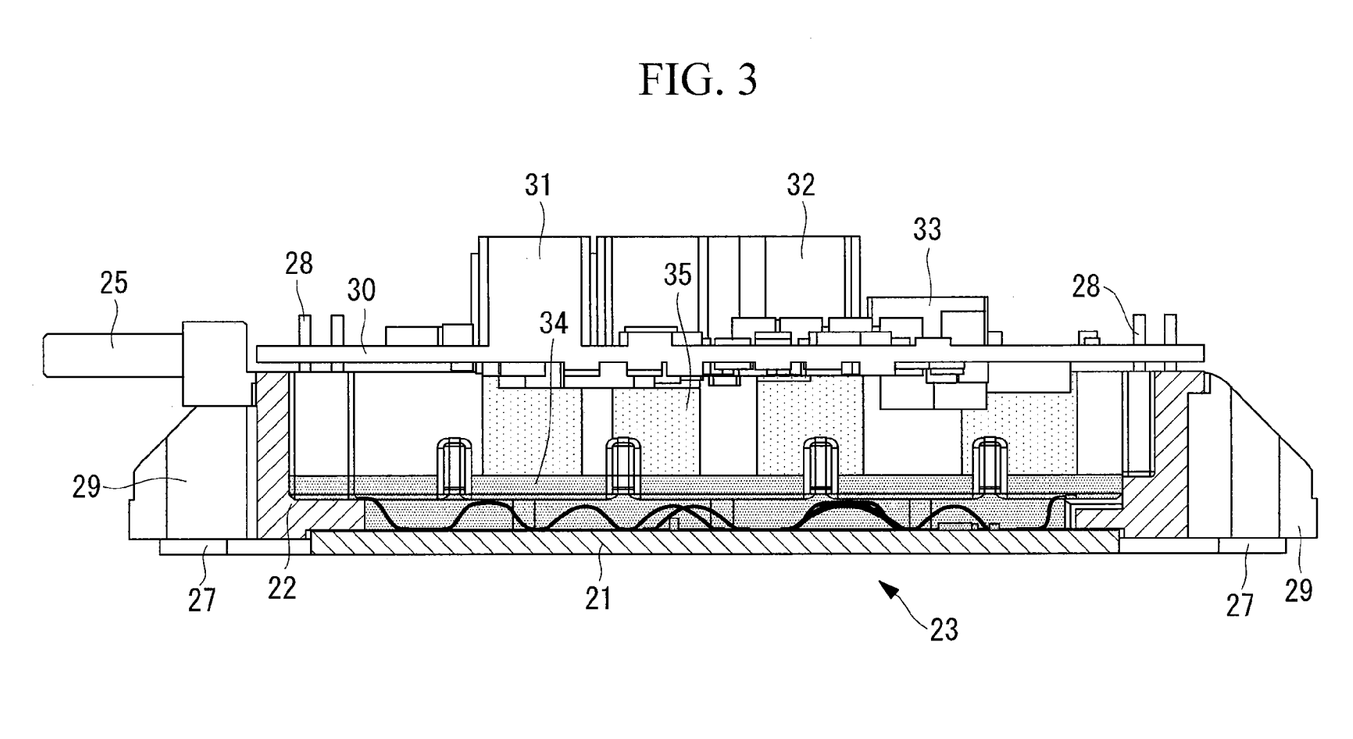
FIG. 3 is a view corresponding to a vertical section A-A of the inverter unit shown in FIG. 2.

The inverter accommodating unit 9 accommodates therein an inverter unit 20 that converts DC power into three-phase AC power, the DC power being supplied via a high-voltage cable from a high-voltage power supply unit, a battery, or the like installed in the vehicle, which are not shown, and that supplies the three-phase AC power to the electric motor accommodated inside the motor housing 3. FIG. 2 shows a perspective view of the inverter unit 20, and FIG. 3 shows a view corresponding to a section A-A in FIG. 2.

The inverter unit 20 includes an inverter module 23 in which a power-system metallic board 21 and a plastic case 22 are integrated by insert molding, the power-system metallic board 21 being formed of an aluminum plate having mounted thereon a plurality of semiconductor switching elements such as IGBTs, a snubber capacitor, a discharge resistor, and so forth, which are not shown. Inside the plastic case 22, in addition to the power-system metallic board 21, P-N terminals 24 that are connected to the high-voltage power supply, U-V-W terminals 25 that supply three-phase AC power to the electric motor, a ground 26 and a ground terminal 27, a large number of connection terminals 28 for connecting the power-system metallic board 21 with a CPU board 30, described later, and so forth are formed integrally by insert molding.

The plastic case 22 has a rectangular shape, with the P-N terminals 24 projecting from one edge located along the side face where the cable lead-out ports 10 of the inverter accommodating unit 9 are formed, and with the U-V-W terminals 25 projecting from an adjacent edge closer to the compressor housing 4. Furthermore, at the corners of the plastic case 22, fastening legs 29 that are fastened to the bottom face of the inverter accommodating unit 9 via bolts are formed integrally. At the fastening legs 29, the ground terminals 27 through which bolts can pass are provided. The arrangement is such that the grounds of the power-system metallic board 21 and the CPU board 30 described later are chassis-grounded by fastening the plastic case 22 to the bottom face of the inverter accommodating unit 9 via bolts.

On the top face of the plastic case 22 constituting the inverter module 23, a CPU board (printed board) 30 slightly larger than the plastic case 22 is provided in connection with the large number of connecting terminals 28 and the ground 26. The CPU board 30 has mounted thereon a control and communication circuit having components that operate at a low voltage, such as a CPU, and it is configured to control a power-system circuit mounted on the power-system metallic board 21. A plurality of relatively large and heavy electrical components constituting the control and communication circuit, such as a transformer 31, an electrolytic capacitor 32, and a coil 33, are provided on the CPU board 30.

Furthermore, in this embodiment, in order to ensure insulation properties, anti-humidity properties, and anti-vibration properties of the power-system metallic board 21 and the CPU board 30 of the inverter unit 20 described above, the following configuration is employed.

Inside the plastic case 22 constituting the inverter module 23, a thermosetting epoxy resin layer (thermosetting resin layer) 34 having superior insulation and anti-humidity properties is provided so as to cover components mounted on the top face of the power-system metallic board 21 having mounted thereon the plurality of semiconductor switching elements such as IGBTs. The epoxy resin layer 34 is provided to ensure anti-vibration properties, as well as insulation and anti-humidity properties, by encapsulating the components mounted on the metallic board 21, such as an aluminum plate, with a thermosetting resin layer so that the components are firmly secured and protected.

Furthermore, inside the plastic case 22, an elastomeric adhesive layer (silicone-resin adhesive layer) 35 that adheres to the bottom face of the CPU board 30 and absorbs vibrations thereof is provided between the top face of the epoxy resin layer 34 and the bottom face of the CPU board 30. The elastomeric adhesive layer 35 can be formed of a silicone-resin adhesive that maintains a rubber state in a temperature range in which the electric compressor 1 is used, i.e., from a low-temperature range at about −40° C. to a high-temperature range at about one hundred and several tens of degrees Celsius (e.g., a product equivalent to SE 9188 manufactured by Dow Corning Toray Co., Ltd.). The glass transition temperature (Tg) of the silicone-resin adhesive constituting the elastomeric adhesive layer 35 is set at or below −40° C.

The elastomeric adhesive layer 35 has a function of absorbing vibrations of the CPU board 30. In order to reduce vibrations effectively while restricting the amount of resin used, as shown in FIG. 3, the elastomeric adhesive layer 35 is provided in association with only a specific area, such as a central area of the CPU board 30 whose periphery is supported on the top face of the plastic case 22 via the connecting terminals 28, or an area under relatively large and heavy electrical components provided on the CPU board 30, such as the transformer 31, the electrolytic capacitor 32, and the coil 33.

With the configuration described above, according to this embodiment, the following operational advantages are achieved.

DC power supplied from the high-voltage power supply unit installed on the vehicle to the inverter unit 20 of the electric compressor 1 via the high-voltage cable is input to the power circuit on the power-system metallic board 21 via the P-N terminals 24 and is converted into three-phase AC power at frequency of control instructions by the switching operation of the semiconductor switching elements controlled by the control circuit on the CPU board 30, and then the three-phase AC power is supplied from the U-V-W terminals 25 to the electric motor inside the motor housing 3 via the glass-sealed terminals.

Thus, the electric motor is driven to rotate at the control instruction frequency, whereby the compressor operates. By the operation of the compressor, low-temperature, low-pressure refrigerant gas is taken into the motor housing 3 from the refrigerant intake port 6. The refrigerant flows around the electric motor toward the compressor housing 4 in the direction of the motor axis L and is then taken into the compressor, where the refrigerant is compressed to a high-temperature, high-pressure state, and the refrigerant is then discharged to the outside of the electric compressor 1 via the discharge port 7.

During this operation, the low-temperature, low-pressure refrigerant gas that is taken into the motor housing 3 from the refrigerant intake port 6 and that flows in the direction of the motor axis L cools the power-system metallic board 21 of the inverter unit 20, which is installed in tight contact at the bottom face of the inverter accommodating unit 9, via the housing wall of the motor housing 3. Thus, heat-generating components mounted on the power-system metallic board 21, such as the semiconductor switching elements, are cooled forcibly. This ensures heat resistance of the inverter unit 20.

Meanwhile, vibrations of the running vehicle in which the electric compressor 1 is installed, vibrations of its driving source, vibrations of the electric compressor 1 itself, and so forth are directly input to the inverter unit 20 integrated in the electric compressor 1. Therefore, these vibrations are transmitted to the power-system metallic board 21 and the CPU board 30 constituting the inverter unit 20 and to electrical components and circuits mounted on these boards.

However, the power-system metallic board 21 forms an integrated module together with the plastic case 22 and is firmly fastened to the bottom face of the inverter accommodating unit 9 via the fastening legs 29 with bolts. Furthermore, the electrical components of the semiconductor switching elements mounted thereon are encapsulated with the thermosetting epoxy resin layer 34 having insulation and anti-humidity properties and is thereby firmly secured and protected. Therefore, it is possible to ensure sufficient insulation properties and anti-humidity properties of the power-system metallic board 21, to which a high voltage is applied. Furthermore, as for vibration, with the rigidity improved, it is possible to ensure sufficient anti-vibration properties.

The CPU board 30 provided on the top face of the inverter module 23, between its bottom face and the thermosetting resin layer 34, is elastically supported by the elastomeric adhesive layer (silicone-resin adhesive layer) 35 bonded in association with a specific area, such as a central area of the CPU board 30 or an area under relatively large and heavy electrical components provided on the CPU board 30, such as the transformer 31, the electrolytic capacitor 32, and the coil 33, so that vibration generating forces applied to the CPU board 30 can be absorbed. Accordingly, vibration (resonance) of the CPU board 30 can be reduced, so that damage to and detachment of the components on the CPU board 30 caused by vibration of the board can be prevented.

Figure 5:
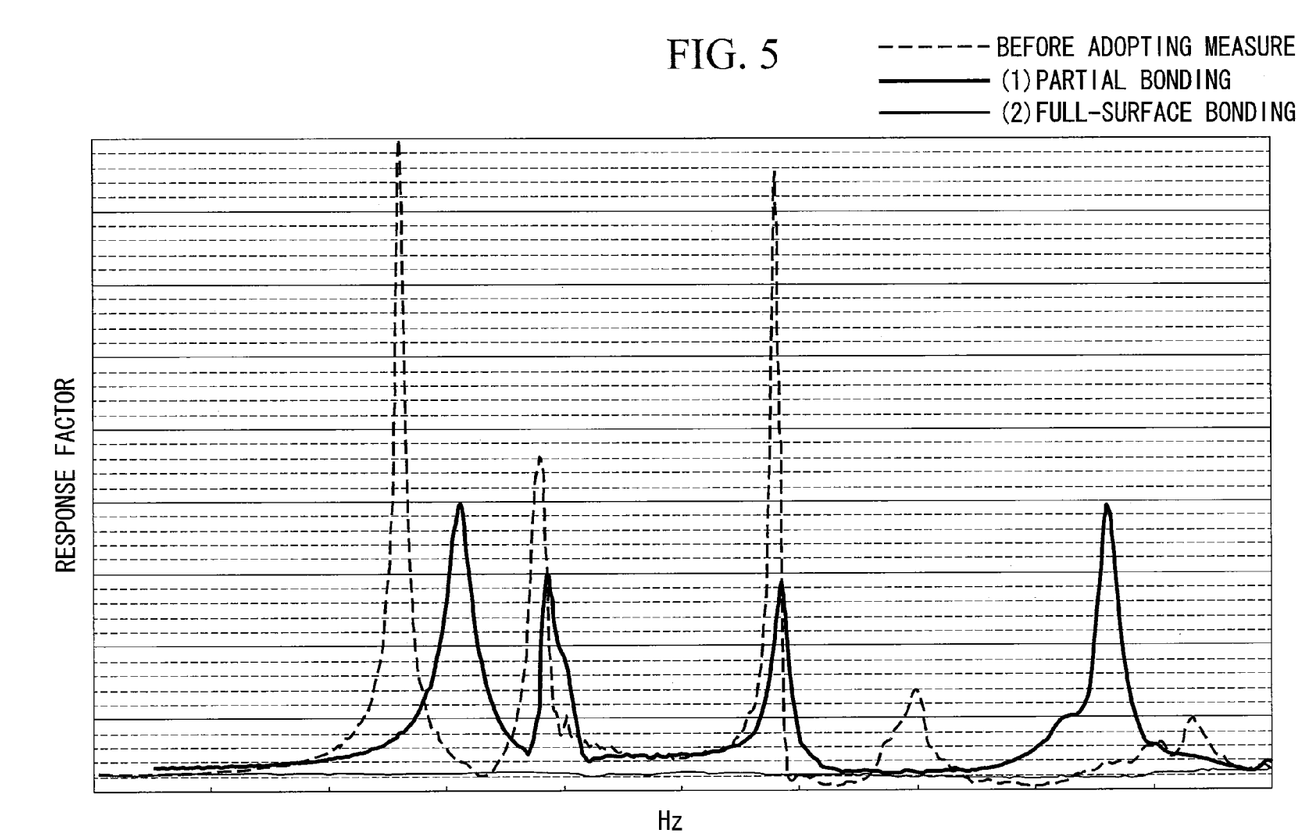
FIG. 5 is a diagram showing a comparison of vibration modes of CPU boards of the inverter units shown in FIGS. 3 and 4 and a CPU board that is not provided with an elastomeric adhesive layer.

FIG. 5 shows a vibration mode of the CPU board 30 (indicated by a thick solid line (1)) in a case where the elastomeric adhesive layer 35 is provided in association with only the specific area described above so that the CPU board 30 is partially bonded, together with a comparative example (a vibration mode indicated by a broken line) before adopting this measure, in which the elastomeric adhesive layer 35 is not provided. As is apparent from the figure, with the configuration in which the elastomeric adhesive layer 35 is provided in association with the specific area of the bottom face of the CPU board 30 so that the CPU board 30 is partially bonded, vibrations of the CPU board 30 can be reduced in a wide frequency range.

As described above, according to this embodiment, the two resin layers 34 and 35 suitable for protecting the power-system metallic board 21 and the CPU board 30, respectively, are provided inside the plastic case 22 of the inverter module 23. Accordingly, it is possible to protect the two boards 21 and 30 individually with a small amount of resin, which serves to improve the reliability of the inverter unit 20 regarding anti-vibration properties and to reduce the weight of the inverter unit 20 and the integrated-inverter electric compressor 1.

In particular, since the elastomeric adhesive layer 35 is provided in association with only a specific area that tends to vibrate, such as a central area of the CPU board 30 or an area under heavy components provided on the CPU board 30, such as the transformer 31, the electrolytic capacitor 32, and the coil 33, it is possible to suppress vibration of the CPU board 30 effectively while restricting the amount of elastomeric adhesive used. Accordingly, it is possible to reduce the weight and cost of the inverter unit 20.

Furthermore, since a silicone-resin adhesive having superior heat resistance and elasticity in a wide temperature range from a low-temperature range to a high-temperature range is used and the glass transition temperature thereof is set at or below −40° C., when applied to the integrated-inverter electric compressor 1 for automobile use, which must be operable in a wide temperature range from about −40° C. to about one hundred and several tens of degrees Celsius, the elastomeric adhesive layer 35 can maintain a rubber state and elastically support the CPU board 30. Therefore, it is possible to attain a sufficient vibration absorbing effect even in a low-temperature environment. Accordingly, it is possible to reliably prevent damage to and detachment of the components on the CPU board 30 caused by vibration of the board, considerably improving the anti-vibration properties of the inverter unit 20.

Furthermore, since the top face of the CPU board 30 is not covered by a resin or the like, it is possible to perform maintenance of the CPU board 30 by removing the lid 11 of the inverter accommodating unit 9. Therefore, maintenance is facilitated compared with the case where the top face of the CPU board 30 is filled with a gel material or the CPU board 30 is encapsulated in resin.

Second Embodiment

Next, a second embodiment of the present invention will be described with reference to FIG. 4.

This embodiment differs from the first embodiment described above in that an elastomeric adhesive layer 35A is provided over the substantially entire region between the bottom face of the CPU board 30 and the thermosetting resin layer 34. This embodiment is otherwise the same as the first embodiment, so that a description thereof will be omitted.

Figure 4:
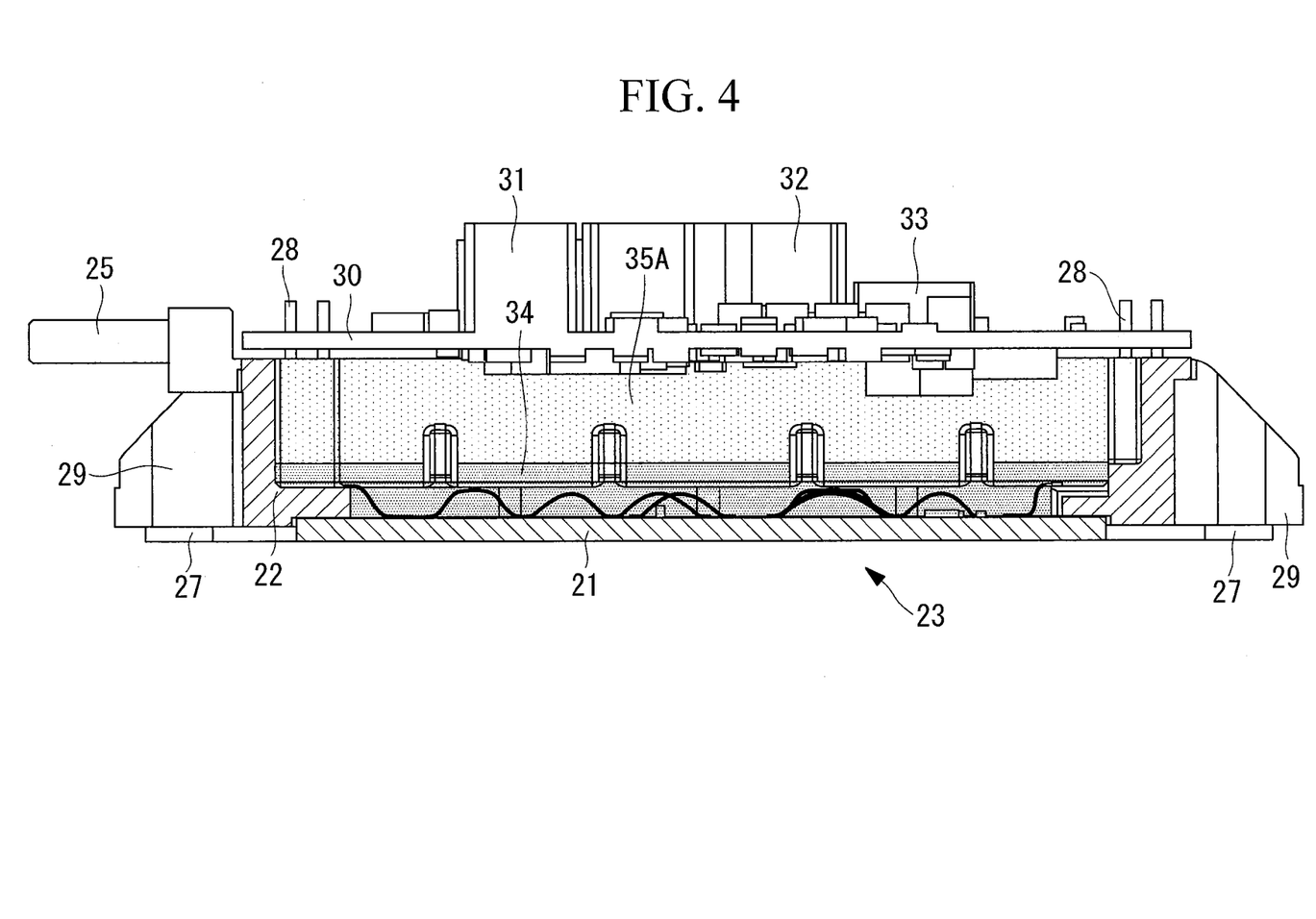
FIG. 4 is a view corresponding to a vertical section of an inverter unit of an integrated-inverter electric compressor according to a second embodiment of the present invention, corresponding to FIG. 3.

As shown in FIG. 4, this embodiment is configured such that the elastomeric adhesive layer 35A is provided over the substantially entire region between the bottom face of the CPU board 30 and the thermosetting resin layer 34 provided on the top face of the power-system metallic board 21.

By providing the elastomeric adhesive layer 35A over the substantially entire region between the bottom face of the CPU board 30 and the thermosetting resin layer 34, as described above, the entire bottom face of the CPU board 30 is supported by the elastomeric adhesive layer 35A, so that vibrations of the CPU board 30 can be absorbed. In this configuration, the bottom face of the CPU board 30 is bonded over the full surface with the elastomeric adhesive layer 35. Thus, as shown in FIG. 5, it is possible to achieve a vibration reducing effect (a vibration mode indicated by a thin solid line (2)) considerably higher than that in the case where the CPU board 30 is partially bonded. Therefore, according to this embodiment, although the amount of elastomeric adhesive material used becomes somewhat larger, it is possible to give priority to reducing vibrations of the CPU board 30, so that the anti-vibration properties of the inverter unit 20 can be further improved.

It is to be noted that the present invention is not limited to the invention according to the embodiments described above, and modifications can be made as appropriate without departing from the spirit thereof. For example, although the embodiments described above are examples where the inverter accommodating unit 9 is formed integrally with the motor housing 3, the inverter accommodating unit 9 need not necessarily be formed integrally therewith, and the arrangement may be such that a separate inverter accommodating unit is attached to the motor housing 3. Furthermore, the compressor is not particularly limited, and any type of compressor may be used.

REFERENCE SIGNS LIST

1 Integrated-inverter electric compressor
2 Housing
9 Inverter accommodating unit
20 Inverter unit
21 Power-system metallic board
22 Plastic case
23 Inverter module
24 P-N terminals
25 U-V-W terminals
28 Connecting terminals
30 CPU board
31 Transformer
32 Electrolytic capacitor
33 Coil
34 Epoxy resin layer (thermosetting resin layer)
35, 35A Elastomeric adhesive layer (silicone-resin adhesive layer)

The invention claimed is:

1. An integrated-inverter electric compressor in which an inverter accommodating unit is provided at the periphery of a housing accommodating an electric motor and a compressor, and an inverter unit that converts DC power from a high-voltage power supply into three-phase AC power and supplies the three-phase AC power to the electric motor is provided in the inverter accommodating unit, wherein the inverter unit includes an inverter module in which a power-system metallic board having mounted thereon semiconductor switching elements is integrated with a plastic case having a plurality of terminals and integrally formed therewith by insert molding, and a CPU board having mounted thereon a control and communication circuit that operates at a low voltage, including a CPU, is provided on a top face of the inverter module, and wherein, inside the plastic case, a thermosetting resin layer for insulation and anti-humidity purposes is provided so as to cover a top face of the power-system metallic board, and a vibration-absorbing elastomeric adhesive layer that maintains a rubber state in an operating temperature range of the electric compressor is provided between a bottom face of the CPU board and the thermosetting resin layer.

2. An integrated-inverter electric compressor according to claim 1, wherein the elastomeric adhesive layer is provided in association with only a specific area, said specific area including a central area of the CPU board or an area under heavy components provided on the CPU board, including a transformer and an electrolytic capacitor.

3. An integrated-inverter electric compressor according to claim 1, wherein the elastomeric adhesive layer is provided over the substantially entire region between the bottom face of the CPU board and the thermosetting resin layer.

4. An integrated-inverter electric compressor according to claim 1, wherein the thermosetting resin layer is formed of an epoxy resin.

5. An integrated-inverter electric compressor according to claim 1, wherein the elastomeric adhesive layer is formed of a silicone-resin adhesive.

6. An integrated-inverter electric compressor according to claim 5, wherein the silicone-resin adhesive has a glass transition temperature set at or below −40° C.

7. A modularized inverter unit that is integrated in an integrated-inverter electric compressor, wherein the inverter unit includes an inverter module in which a power-system metallic board having mounted thereon semiconductor switching elements and so forth is integrated with a plastic case having a plurality of terminals and integrally formed therewith by insert molding, and a CPU board having mounted thereon a control and communication circuit that operates at a low voltage, including a CPU, is provided on a top face of the inverter module, and wherein, inside the plastic case, a thermosetting resin layer for insulation and anti-humidity purposes is provided so as to cover a top face of the power-system metallic board, and a vibration-absorbing elastomeric adhesive layer that maintains a rubber state in an operating temperature range of the electric compressor is provided between a bottom face of the CPU board and the thermosetting resin layer.

* * * * *